(12) United States Patent
Wasserbauer

(10) Patent No.: US 6,879,612 B1
(45) Date of Patent: Apr. 12, 2005

(54) TEMPERATURE INSENSITIVE VCSEL

(75) Inventor: John Wasserbauer, Erie, CO (US)

(73) Assignee: Optical Communication Products, Inc., Woodland Hills, CA (US)

( * ) Notice: Subject to any disclaimer, the term of this patent is extended or adjusted under 35 U.S.C. 154(b) by 0 days.

(21) Appl. No.: 10/054,826

(22) Filed: Jan. 23, 2002

Related U.S. Application Data

(60) Provisional application No. 60/263,420, filed on Jan. 23, 2001.

(51) Int. Cl.[7] .............................................. H01S 5/00
(52) U.S. Cl. ............................ 372/45; 372/43; 372/44; 372/46; 372/47; 372/48; 372/49; 372/50
(58) Field of Search ............................... 372/43–50, 99, 372/92

(56) References Cited

U.S. PATENT DOCUMENTS

| | | | | |
|---|---|---|---|---|
| 5,080,504 A | * | 1/1992 | Partain et al. ................. 385/17 |
| 5,274,655 A | | 12/1993 | Shieh | |
| 5,712,865 A | * | 1/1998 | Chow et al. .................. 372/96 |
| 5,719,894 A | * | 2/1998 | Jewell et al. ................. 372/45 |
| 5,719,895 A | * | 2/1998 | Jewell et al. ................. 372/45 |
| 5,748,661 A | * | 5/1998 | Kiely et al. ................... 372/50 |
| 5,796,796 A | * | 8/1998 | Wang .......................... 375/372 |
| 5,825,796 A | * | 10/1998 | Jewell et al. ................. 372/45 |
| 5,859,864 A | * | 1/1999 | Jewell ........................ 372/45 |
| 5,960,018 A | * | 9/1999 | Jewell et al. ................. 372/45 |
| 6,258,615 B1 | * | 7/2001 | Hou et al. .................... 438/35 |
| 6,261,859 B1 | * | 7/2001 | Ouchi ......................... 438/39 |
| 6,339,496 B1 | * | 1/2002 | Koley et al. ................. 359/344 |
| 6,347,106 B1 | * | 2/2002 | Dijaili et al. ................. 372/46 |
| 6,359,920 B1 | * | 3/2002 | Jewell et al. ................. 372/46 |
| 6,459,709 B1 | * | 10/2002 | Lo et al. ....................... 372/20 |
| 6,546,031 B1 | * | 4/2003 | Jewell et al. ................. 372/45 |
| 6,584,130 B2 | * | 6/2003 | Hanke ......................... 372/50 |

* cited by examiner

*Primary Examiner*—Minsun Oh Harvey
*Assistant Examiner*—Delma R. Flores-Ruiz
(74) *Attorney, Agent, or Firm*—Barlow, Josephs & Holmes, Ltd.

(57) ABSTRACT

A temperature insensitive vertical cavity laser includes an active region, having a plurality of quantum wells, formed between first and second mirrors. The gain of each of said quantum wells or groups of quantum wells operate quasi-independently at different temperatures such that stimulated emission is dominated by a different quantum well or group of quantum wells at different temperatures.

28 Claims, 9 Drawing Sheets

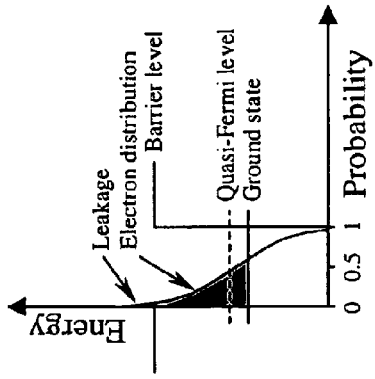
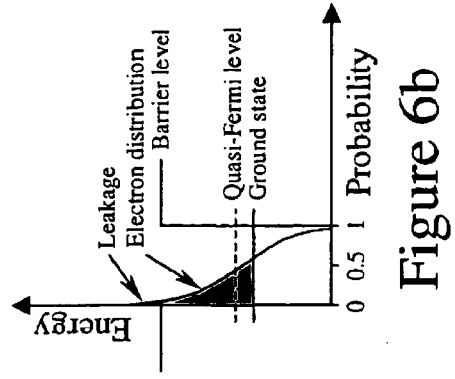
Figure 5a
Figure 6b
Figure 4
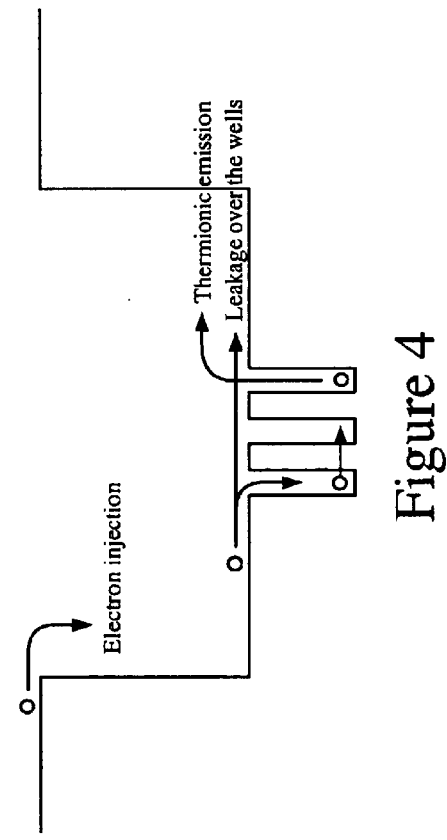
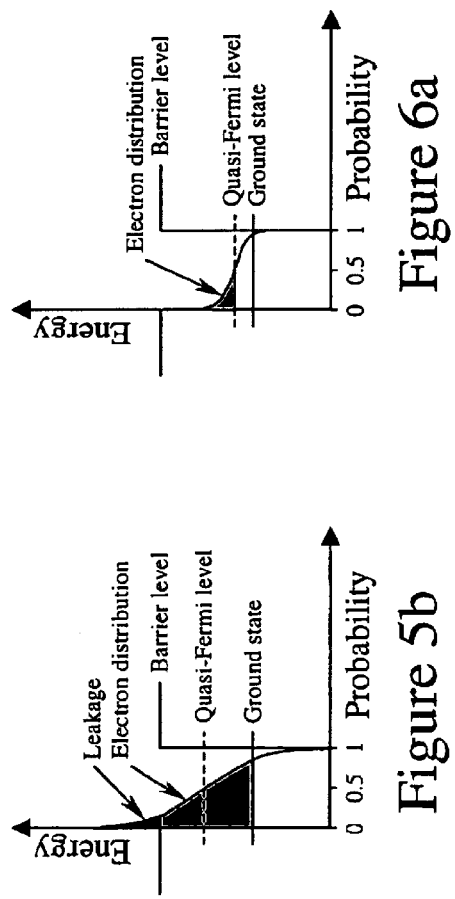
Figure 6a
Figure 5b

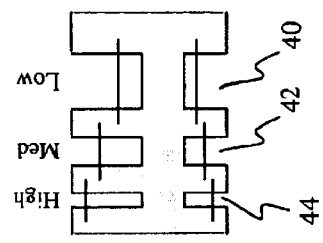
Figure 8
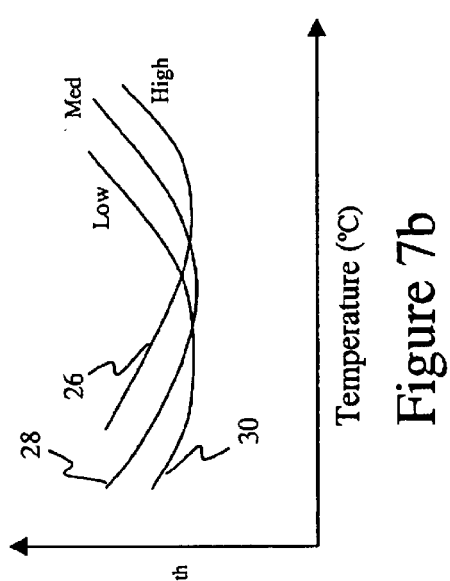
Figure 7b
Figure 7a
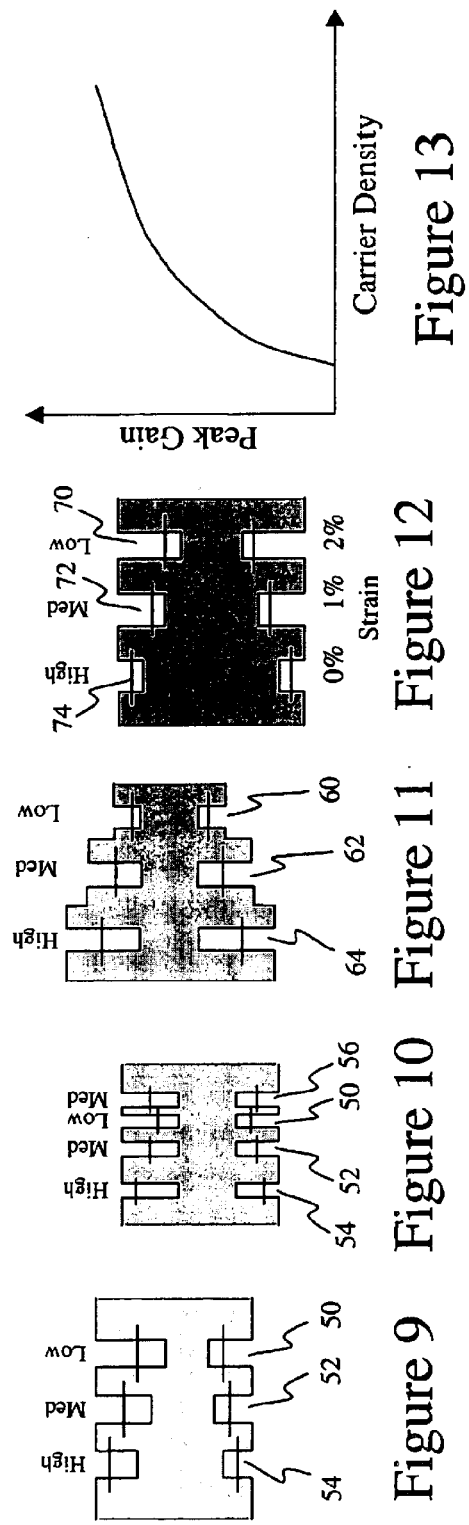
Figure 13
Figure 12
Figure 11
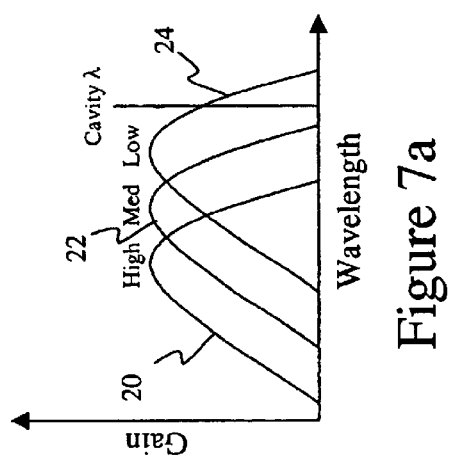
Figure 10
Figure 9

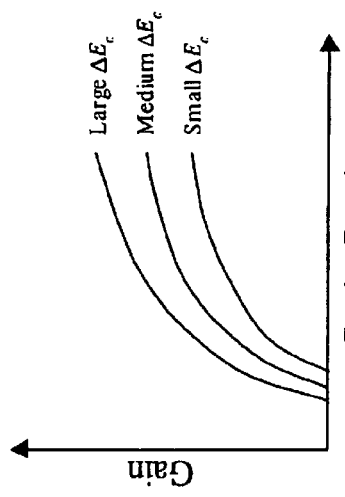
Figure 16
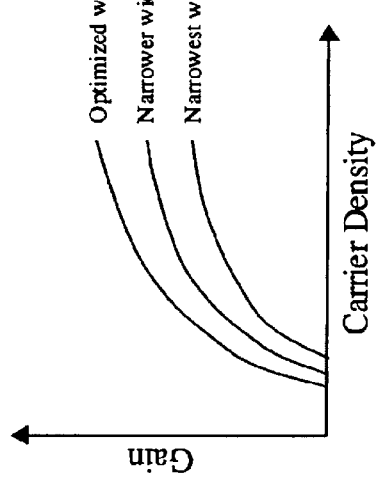
Figure 17
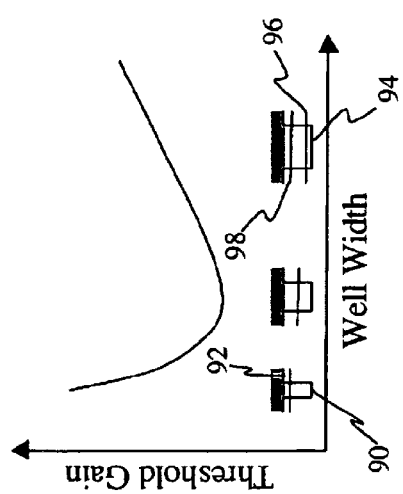
Figure 18
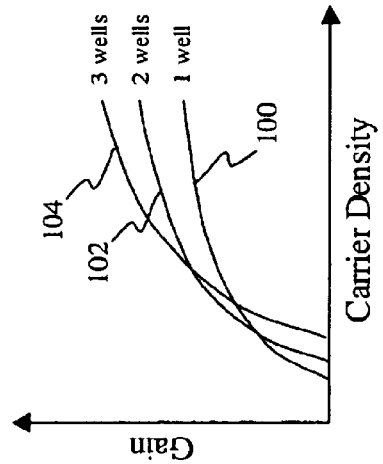
Figure 19
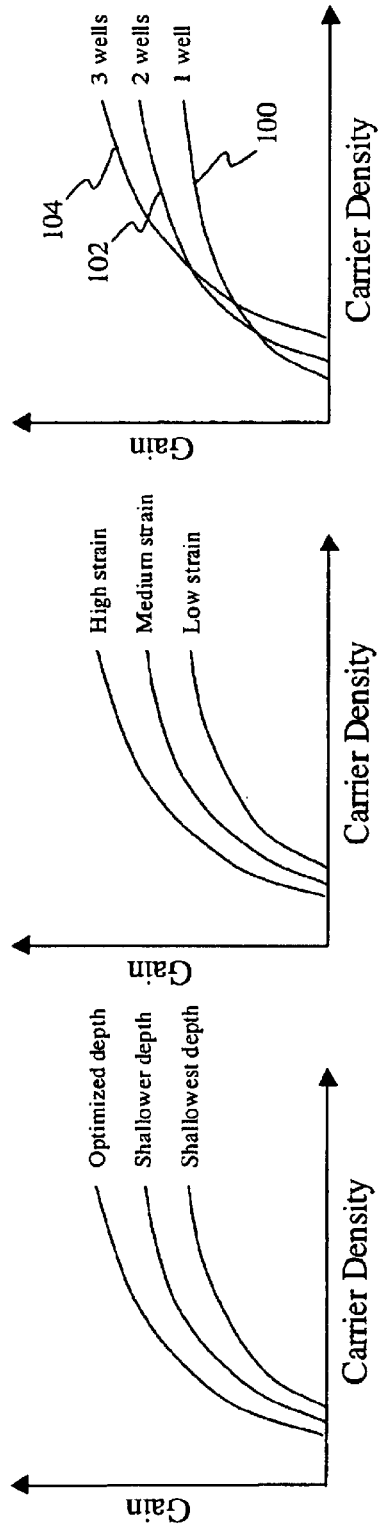
Figure 20
Figure 21

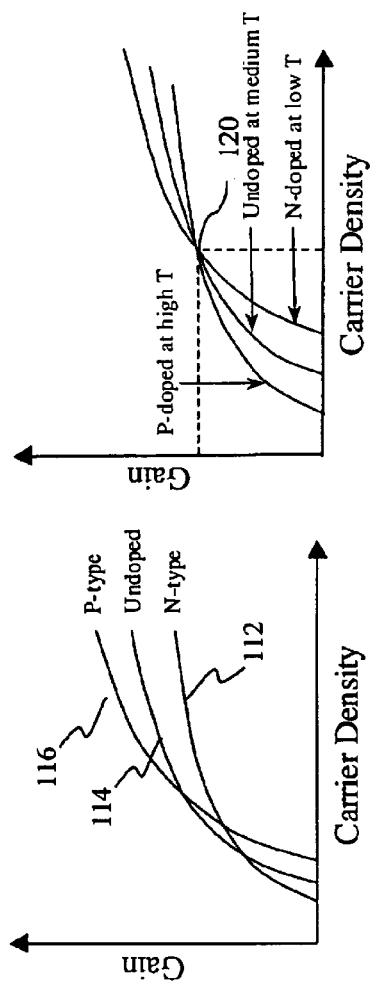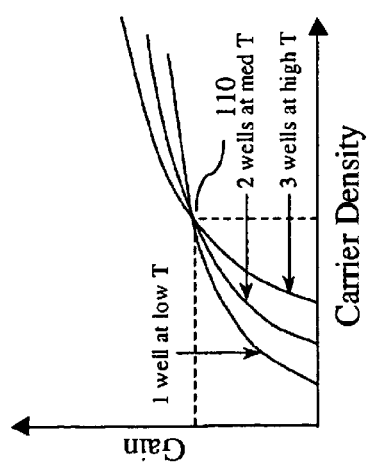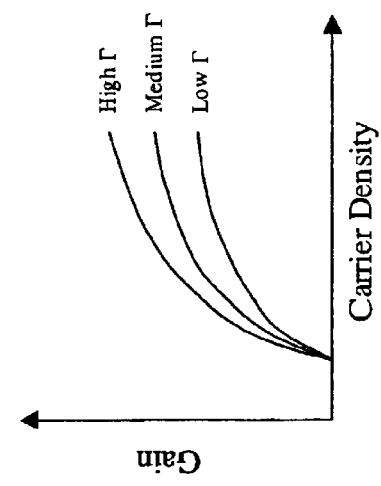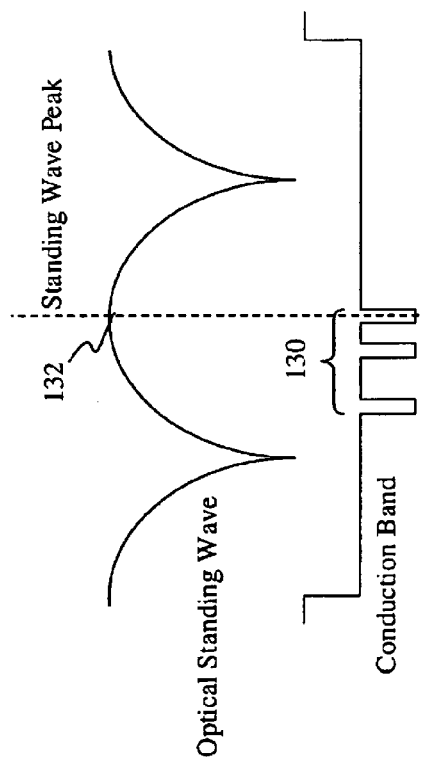
Figure 22
Figure 23
Figure 24
Figure 25
Figure 26

TEMPERATURE INSENSITIVE VCSEL

CROSS REFERENCE TO RELATED APPLICATION

The application claims priority of U.S. Provisional Patent application Ser. No. 60/263,240, entitled "TEMPERATURE INSENSITIVE VCSEL" filed on Jan. 23, 2001 the content of which is incorporated herein by reference.

FIELD OF THE INVENTION

This invention generally relates to semiconductor lasers and more particularly to Vertical Cavity Surface Emitting Lasers (VCSELs).

BACKGROUND OF THE INVENTION

Semiconductor lasers in general and VCSELs in particular are widely used as optical sources in fiber-optic communication links. VCSELs may be driven by an RF signal that represents information to be transmitted over the optical fiber. VCSEL performance (slope efficiency and threshold) typically varies as a function of temperature. For example, for a certain value of gain offset, the threshold current of a given VCSEL increases with rising temperature while the output level or intensity of the emitted light decreases with rising temperature.

In operation, however, VCSELs typically must perform over a temperature range on the order of about 80° C. due to variation in ambient temperature and heating in the device package. Therefore, VCSELs commonly require some form of temperature compensation. Conventional temperature compensation approaches fall broadly into two categories, namely optical feedback and active cooling. The optical feedback approach involves deflecting a portion of the light onto a photodetector. The output current of the photodetector is proportional to the intensity of the light incident upon it and is typically fed back as an input to the VCSEL drive circuitry. A significant disadvantage of conventional power monitoring systems is that depending on the beam qualities of the laser, a varying fraction of the radiated light may be incident on the photodetector, which may result in inaccurate monitoring. The major drawbacks of active cooling are 1) it is expensive, 2) thermoelectric (TE) coolers consume relatively large amounts of power and 3) TE coolers are unreliable.

Therefore, conventional systems typically incorporate large area photodiodes to capture a sufficient percentage of reflected light in an attempt to provide accurate feedback over temperature. In addition, the driver circuitry for optical feedback systems is often complex and increases the cost and power requirements of the system.

BRIEF DESCRIPTION OF THE DRAWINGS

These and other features, aspects, and advantages of the present invention will become better understood with regard to the following description, appended claims, and accompanying drawings where:

FIG. 4 graphically illustrates two of the principal leakage currents that occur in the conduction band of a multi-quantum well active area, namely, leakage over the quantum wells and thermionic emission out of the quantum wells;

FIG. 5 graphically illustrates the effect of bias current on the electron distribution in a quantum well. A conduction band diagram of a quantum well is superimposed on the Fermi-Dirac probability function. The shaded areas (black and gray) indicated the free electron energy distribution. In a), at a low bias condition, the quasi Fermi-level lies just above the quantum level and the small black shaded region indicates the electron population that leaks over the quantum well. In b), under a higher bias condition, the quasi Fermi-level rises significantly above the quantum level and the black shaded region indicates the greater electron population that leaks over the quantum well;

FIG. 6 graphically illustrates the effect of temperature on the electron distribution in a quantum well. A conduction band diagram of a quantum well is superimposed on the Fermi-Dirac probability function. The shaded areas (black and gray) indicate the free electron energy distribution. In a), at a low temperature, the electron distribution is completely contained within the quantum well. In b), at a higher temperature, the electron distribution penetrates the barrier states and the black shaded region indicates the electron population that has leaked out of the well;

FIG. 7 graphically illustrates the gain spectrums (a) and temperature sensitivity of the threshold (b) of gain separated wells intended to operate at low, medium and high temperature in accordance with an exemplary embodiment of the present invention;

FIG. 8 graphically illustrates the method of gain separation via well thickness for wells intended to operate at low, medium and high temperature in accordance with an exemplary embodiment of the present invention;

FIG. 9 graphically illustrates the method of gain separation via well depth for wells intended to operate at low, medium and high temperature in accordance with an exemplary embodiment of the present invention;

FIG. 10 graphically illustrates the method of gain separation via barrier thickness for wells intended to operate at low, medium and high temperature;

FIG. 11 graphically illustrates the method of gain separation via barrier height for wells intended to operate at low, medium and high temperature in accordance with an exemplary embodiment of the present invention;

FIG. 12 graphically illustrates the method of gain separation via strain for wells intended to operate at low, medium and high temperature in accordance with an exemplary embodiment of the present invention;

FIG. 13 graphically illustrates the logarithmic variation of gain with injected current density in accordance with an exemplary embodiment of the present invention;

FIG. 16 graphically illustrates the dependence of threshold gain on quantum well thickness;

FIG. 17 graphically illustrates the gain-current density characteristics of quantum wells of different thickness in accordance with an exemplary embodiment of the present invention;

FIG. 18 graphically illustrates the gain-current density characteristics of quantum wells of different barrier height in accordance with an exemplary embodiment of the present invention;

FIG. 19 graphically illustrates the gain-current density characteristics of quantum wells of different depth in accordance with an exemplary embodiment of the present invention;

FIG. 20 graphically illustrates the gain-current density characteristics of quantum wells of different strain in accordance with an exemplary embodiment of the present invention;

FIG. 21 graphically illustrates the gain-current density characteristics for different numbers of quantum wells in accordance with an exemplary embodiment of the present invention;

FIG. 22 graphically illustrates the gain-current density characteristics for different numbers of quantum wells at different temperatures in accordance with an exemplary embodiment of the present invention;

FIG. 23 graphically illustrates the gain-current density characteristics of quantum wells of different doping in accordance with an exemplary embodiment of the present invention;

FIG. 24 graphically illustrates the gain-current density characteristics of quantum wells of different doping at different temperatures; in accordance with an exemplary embodiment of the present invention;

FIG. 25 graphically illustrates the placement of quantum wells with respect to the optical mode peak leading to different confinement factors; low, medium, and high in accordance with an exemplary embodiment of the present invention;

FIG. 26 graphically illustrates the gain-current density characteristics of quantum wells of different confinement factor in accordance with an exemplary embodiment of the present invention;

SUMMARY OF THE INVENTION

Figure 1A:
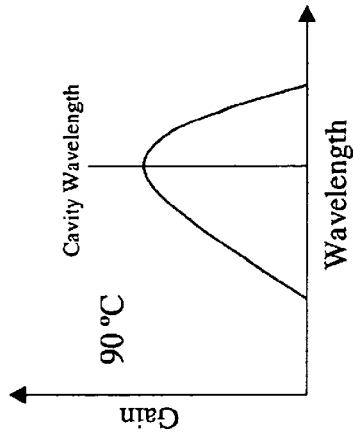
FIG. 1 graphically illustrates the motion of gain peak and cavity wavelengths for various temperatures, a) 10° C., b) 45° C. and c) 90° C.

There is therefore provided in an exemplary embodiment of the present invention a VCSEL with an active region having a plurality of gain separated quantum wells that operate quasi-independently over temperature. The quantum wells are also gain matched such that the fraction of carriers that contribute to stimulated emission, and therefore the slope efficiency, is substantially constant over temperature.

In another aspect of the present invention a method for forming a temperature insensitive surface emitting laser includes forming an active region on a first mirror, wherein the active region comprises a plurality of gain separated quantum wells that operate quasi-independently over temperature and wherein the quantum wells are gained matched such that the fraction of carriers that contribute to stimulated emission is substantially constant over temperature.

DETAILED DESCRIPTION OF THE INVENTION

The present invention provides a method and apparatus for stabilizing the performance of surface emitting lasers over a range of operating temperatures. In accordance with an exemplary embodiment the active area of a surface emitting laser may comprise a plurality of quantum wells. In the described exemplary embodiment the gain peak wavelength of the wells or groups of wells may be separated to provide quasi-independent operation over temperature to stabilize the performance of the laser over a range of operating temperatures. In addition, once sufficient gain separation has been achieved, the quantum wells within the active region may be gain matched at different temperatures. In accordance with an exemplary embodiment, a gain matched active region largely maintains the fraction of carriers contributing to stimulated emission, and therefore the internal quantum efficiency, $\eta_1$, and slope efficiency, $\eta$, constant over temperature. In the described exemplary embodiment, gain matching may be achieved by altering the shape of the modal gain/carrier density characteristic such that the carrier leakage is substantially the same fraction of the total operating carrier density over a range of operating temperatures.

When discussing the temperature sensitivity of a semiconductor laser, we are referring primarily to the changes that occur in the threshold current and slope efficiency. We now discuss each of these in turn.

Threshold Current Temperature Sensitivity

The temperature sensitivity of the threshold current of a vertical cavity laser arises primarily from the shape of the gain curve and the relative movement of the gain peak and cavity wavelengths with laser junction temperature. In operation the junction temperature may increase with increasing laser bias current and/or increasing ambient temperature. The threshold current may also be influenced by the change in leakage current with temperature, as will be discussed later. In general, the gain peak wavelength varies on the order of about 0.3 nanometers per degree Celsius (0.3 nm/° C.), while the resonant cavity wavelength generally varies about an order of magnitude less or about 0.08 nm/° C.

Figure 1B:
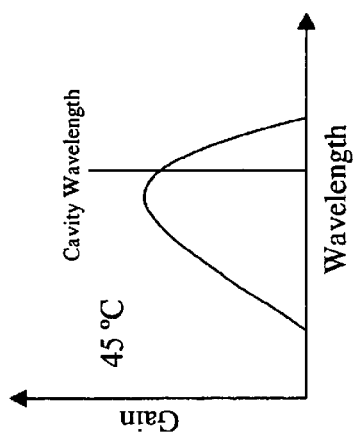
Figure 1C:
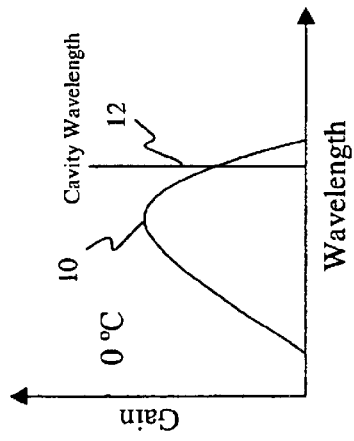
Figure 2:
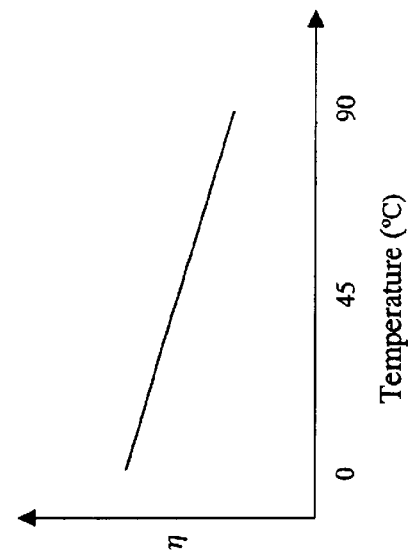
FIG. 2 graphically illustrates the variation of threshold current with temperature for a VCSEL with a certain gain offset.

Therefore, as the junction temperature increases the gain peak moves from shorter to longer wavelengths relative to the cavity wavelength, as generally illustrated in FIGS. 1(a–c). Conventionally, the gain peak wavelength 10 is less than the cavity wavelength 12 for relatively low junction temperatures (see FIG. 1a). However, the gain peak wavelength moves closer to the cavity wavelength with increasing junction temperature (see FIG. 1b). In fact for sufficiently high junction temperatures the gain peak wavelength may equal or surpass the cavity wavelength (see FIG. 1c). This relative motion brings the two wavelengths closer to or moves them further from a condition called resonance, which is defined as the cavity-to-gain-peak wavelength spacing (hereinafter called the gain offset) that produces the minimum threshold, such as shown in FIG. 1b. Since the gain curve is peaked instead of flat, this motion produces a variation in threshold current as a function of temperature, as exemplified in FIG. 2.

Slope Efficiency Temperature Sensitivity

The slope efficiency, $\eta$, of a semiconductor laser is given by Eq. 1.

$$\eta = A\eta_i \frac{\alpha_m}{\alpha_i + \alpha_m}, \quad (1)$$

where A is a constant, $\eta_i$ is the internal quantum efficiency, and $\alpha_i$ and $\alpha_m$ are the internal loss and mirror loss, respectively. It is theoretically possible to maintain $\eta$ relatively constant with temperature by adjusting one or more of the parameters $\eta_i$, $\alpha_i$ or $\alpha_m$ over temperature.

Figure 3:
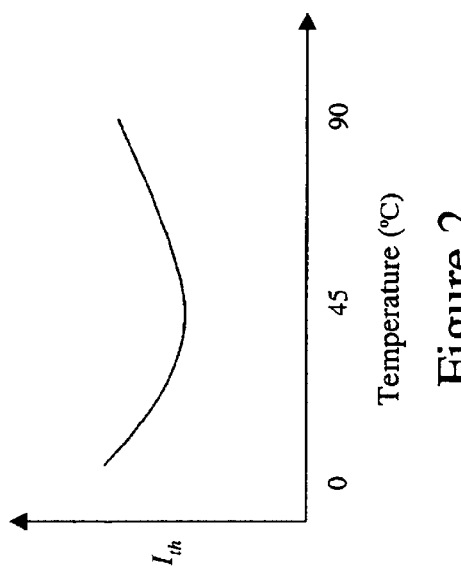
FIG. 3 graphically illustrates the variation of slope efficiency with temperature.

In practice, both $\alpha_i$ and $\alpha_m$ are primarily determined by the VCSEL structure (waveguide and mirror design, respectively) and are relatively insensitive to temperature. In a semiconductor laser, the variation of $\eta$ with temperature primarily arises from a reduction in $\eta_i$ with increasing temperature. $\eta_i$ is a measure of the amount of carrier leakage present in the device. Lower $\eta_i$ is therefore an indication of increased carrier leakage, and also that carrier leakage has become a greater fraction of the total carrier density. In practice, carrier leakage increases with temperature, so that $\eta_i$ and $\eta$, are also reduced, as illustrated in FIG. 3.

There are two principal carrier leakage mechanisms in the active area of a quantum well laser, both of which are illustrated in FIG. 4. The figure represents the conduction band of a multiple quantum well (MQW), separate confinement heterostructure (SCH) active area. The vertical axis indicates the band energy of the material, while the horizontal axis represents position in the structure along the direction of current flow. The first leakage current is composed of electrons that are not captured by a quantum well, and the second is composed of electrons that are captured, but then acquire enough energy to exit the well.

In the case of the first mechanism, electrons that enter the SCH from the cathode carry extra kinetic energy. Without collisions with the lattice or other electrons to reduce their energy, the electrons may be able to bypass the quantum wells without being captured. This phenomenon is known as leakage over the quantum wells. In the case of the second mechanism, if the temperature of the lattice is sufficiently high, an electron in a well may acquire enough energy from the lattice (through absorption of a phonon) to escape the well. This phenomenon is known as thermionic emission.

In operation the levels of leakage over the quantum wells and thermionic emission generally increase with increasing current flow and increasing temperature. FIGS. 5a and 5b graphically illustrate the electron distribution superimposed on a quantum well for two different levels of current flow. For the lower current flow of FIG. 5a, the quasi-Fermi level sits near the quantum state and few electrons have an energy that exceeds the barrier energy. For a higher current flow, as in FIG. 5b, the quasi-Fermi level is elevated in energy, promoting some electrons to energy levels that exceed the barrier height. If these high-energy electrons do not lose their energy to collisions, they may pass over the quantum wells without being captured.

FIGS 6a and 6b show the electron distribution superimposed on a quantum well for two different temperatures. The electron distribution for the lower temperature as illustrated in FIG. 6a, is relatively sharp, that is, it has a relatively abrupt transition at the quasi-Fermi level. This abrupt transition indicates that most of the electrons have about the same energy and sit close to the bottom of the well. However, as illustrated in FIG. 6b, the electron distribution spreads out with increasing temperature. The quasi-Fermi energy level remains relatively constant with temperature, but in this instance there are more electrons at the higher end of the energy distribution. Provided that they do not lose their energy to collisions, these high-energy electrons may exit the quantum wells and move away.

In operation the variation of electron distribution as a function of current level and temperature may increase the fraction of injected carriers that do not contribute to the gain, and may therefore reduce $\eta_i$. Carrier leakage may therefore contribute to the temperature sensitivity of both the threshold and the slope efficiency of semiconductor lasers, although it has a greater effect on the latter than on the former.

One of ordinary skill in the art will appreciate that there are distinctions between there two leakage mechanisms. First, leakage over the quantum well is primarily driven by current injection, whereas leakage out of the well is primarily driven by temperature. Leakage over the well due to excessive current injection is a primary cause of laser rollover for large, non-thermally limited lasers. Leakage out of the well is a primary reason for the change in threshold current and slope efficiency with temperature and is therefore the primary mechanism addressed by the present invention. Leakage out of the well may be addressed by increasing the effective well depth, e.g. using a narrower bandgap material in the wells or a wider bandgap material in the barriers or both. However, this approach is difficult to realize and often material-limited. Unfortunately, there is limited control over the effects of thermionic emission and they are always present.

From the above discussion it should be evident that there are two approaches to improving the temperature stability of VCSELs. First, substantially reducing or eliminating carrier leakage in the active area may reduce the effects of temperature on threshold current and slope efficiency. Second, changing $\eta_i$ at the operating point by modifying the shape of the gain curve-temperature characteristic may also mitigate the effects of temperature on the threshold current and slope efficiency. The latter is a two-step process of gain separation and gain matching. We next discuss each of these approaches in turn.

REDUCTION OF CARRIER LEAKAGE

One method for reducing the temperature sensitivity of the slope efficiency is to reduce carrier leakage. In most semiconductor materials systems, it is necessary only to focus on capturing and confining the electrons in the quantum wells, since holes have a much greater effective mass and are therefore slower and more readily captured and confined. An effective optical cavity for capturing and confining electrons in a quantum well may comprise wells having large barrier heights such that thermionic emission is significantly reduced, but limited barrier thickness so that efficient carrier transport may occur between wells.

When tunneling is the primary method of transport between quantum well, the electron distribution maintains its lowest possible energy state providing for maximum gain. The drawback to allowing too much tunneling between wells is that the quantum states tend to spread out in energy, broadening the gain peak and reducing its amplitude. This is the extreme case of strongly coupled quantum wells. Conventionally, in most material systems. VCSEL designs attempt to maintain weak coupling between wells. Further, conventional VCSELs attempt to keep the energy of the lowest quantum state, known as the ground state, as far as possible from the next highest quantum state or barrier state.

For example, in an exemplary embodiment for the GaAs/AlGaAs material system, the wells may comprise 40–60 Å GaAs layers and the barriers comprise 80–100 Å $Al_{0.25}Ga_{0.75}As$ layers. A 20 Å AlAs barrier is placed on the n-side to prevent hot carriers from passing over the quantum wells. This type of active area is known in the art as a tunneling injection active area. The tunneling barrier ensures that the excess kinetic energy of the injected electrons is given up to the lattice prior to the electrons' capture by the quantum wells. Thus, only "cold" electrons are injected into the active area, improving the probability of capture and reducing leakage over the wells.

In operation however, even VCSELs having an optimized active area with large barrier heights may incur a temperature related reduction in quantum efficiency due to carrier heating. Therefore, reduction of carrier leakage alone may not be sufficient to produce a temperature-insensitive slope efficiency.

GAIN SEPARATION AND GAIN MATCHING

Alternatively, the shape of the gain curve-temperature characteristic may be modified to reduce the effects of temperature on the threshold current and slope efficiency. In practice this may be a preferred method for mitigating the effects of temperature for materials systems where large electron barrier heights are not available or are difficult to grow.

The active area of a VCSEL having a modified gain curve-temperature characteristic may comprise quantum wells that operate quasi-independently over temperature. The creation of wells that operate quasi-independently over temperature is termed "gain separation". In accordance with an exemplary embodiment, the quantum wells may be designed to have different gain peak wavelengths 20, 22 and 24 and corresponding gain offsets, as illustrated in FIG. 7a.

Despite the different gain peak wavelengths, lasing will occur at the cavity wavelength. In the described exemplary embodiment the well (or wells) 24 intended to dominate at the lowest operating temperature has the smallest gain offset, while the well (or wells) 20 intended to dominate at the highest operating temperature has the largest gain offset. It follows that the low temperature well(s) exhibits the gain peak at the shortest wavelength and the high temperature well(s) exhibits the gain peak at the longest wavelength. The resulting temperature sensitivity the threshold current 26, 28 and 30 for each of the wells 20, 22 and 24 is graphically illustrated in FIG. 7b. The well 24 with the least gain offset has a threshold minimum at the lowest temperature, while the well 20 with the most gain offset has a threshold minimum at the highest temperature. The amount of gain offset required to reduce temperature sensitivity may be empirically determined in accordance with the amount of additional leakage required at low temperature to match the leakage at high temperature. This subject is discussed in more detail in the sections on gain matching.

Methods of Gain Separation

The gain peak wavelength of an exemplary quantum well may be modified by varying one or more of a variety of well characteristics. For example, the gain peak wavelength may be modified by varying the thickness of the quantum well, the depth of the quantum well, the thickness of the barrier layers between wells, the well-to-barrier band offsets, the strain of the well or a combination of any of the above.

Quantum Well Thickness

In accordance with an exemplary embodiment, the well thickness may be increased from well to well, so that the transition energy and therefore the gain peak wavelength moves from shorter to longer wavelengths. For example, in an exemplary embodiment, an active area may comprise three GaAs quantum wells having thicknesses of 43, 53, and 63 Å, corresponding to gain peak wavelengths of 811, 819 and 830 nm, respectively. FIG. 8 graphically illustrates the band diagram of the described exemplary active area. In this instance the widest well 40 has the longest gain peak wavelength and therefore the smallest gain offset. The well with the greatest thickness therefore dominates the operation of the laser at low temperatures and is therefore labeled "low" in FIG. 8. The wells 42 and 44 having a narrower thickness have shorter gain peak wavelengths and therefore larger gain offsets. Therefore, wells 42 and 44 dominate at medium and high temperatures respectively and are labeled "medium" and "high" in FIG. 8.

Quantum Well Depth

The material composition of the quantum well determines the conduction and valence band offsets between the well and barrier layer. The valence band offset between the well and barrier layers as well as the thickness of the quantum well determine the energy of the quantum state(s). For example, in the GaAs/AlGaAs material system, the deepest well(s), having the greatest valence band offset, is typically formed from a GaAs binary composition. The band offsets may be reduced by incorporating small amounts of Al into the GaAs well layer.

FIG. 9 graphically illustrates the conduction band diagram of an exemplary active area having quantum wells with varying well depth. In this instance the deepest well 50 has the longest gain peak wavelength and therefore the smallest gain offset. This well may therefore dominate the operation of the laser at low temperatures and is therefore labeled "low" in FIG. 9. The wells 52 and 54 that have a reduced well depth have shorter gain peak wavelengths and therefore larger gain offsets. These wells 52 and 54 dominate at medium and high temperatures respectively and are labeled "medium" and "high" in FIG. 9.

Quantum Well Barrier Thickness

The gain curve-temperature characteristic may also be modified by varying the thickness of the barrier layers. In the case of very thin wells (less than 40 Å) the penetration of the electron and hole wave functions into the barrier layer may be significant. When the barrier thickness is on the order of the penetration depth or less, the energy level of the quantum state may be significantly altered.

The conduction band diagram of an exemplary active area having barrier layers with varying thickness is graphically illustrated in FIG. 10. In the described exemplary embodiment, the well 50 with the smallest barrier thickness has the longest gain peak wavelength and therefore the smallest gain offset and vice versa. Wells 52, 54 with greater barrier thickness have shorter gain peak wavelengths, and therefore larger gain offsets. The wells that dominate at low, medium and high temperatures are labeled "low", "medium" and "high" in FIG. 10, respectively.

In practice, varying the thickness of the barrier layers may not be the most effective method for modifying the gain curve-temperature characteristic because the gain peak wavelength is not strongly dependent on the thickness of the barrier layers. Furthermore, as the barrier thickness is reduced coupling between wells may increase and the wells may no longer act independently, as is required for gain separation. Finally, since quantum wells are usually surrounded by a thick separate confinement heterostructure (SCH) it is difficult to make only one type of each well, since at least one wells 56 adjacent to the SCH will have an intermediate wavelength. However, an active area having barrier layers with varying thickness may be used in conjunction with other methods to modify the gain curve-temperature characteristic.

Well-to-Barrier Conduction Band Offset

In an alternative embodiment the well-to-barrier band offset, $\Delta E_g$, may be varied from well to well to increase the transition energy and separate the gain peak wavelengths. An illustrative band diagram of an active area having barrier layers with varying band offsets is graphically illustrated in FIG. 11. In this embodiment the well with the smallest $\Delta E_g$ would have the longest gain peak wavelength and therefore the smallest gain offset and vice versa. The wells 60, 62 and 64 that dominate at low, medium and high temperatures are labeled "low", "medium" and "high" in FIG. 11, respectively. In the $Al_xGa_{1-x}As$ material system, $\Delta E_g$ is largely determined by the Al composition, wherein larger values of x yield a material having a larger $\Delta E_g$.

Quantum Well Strain

In accordance with an alternate embodiment, strain may be added to the quantum wells to modify the gain curve-temperature characteristic. For example, strain in the quantum well changes the conduction and valence band offsets between a quantum well and barrier layer, which, in conjunction with quantum well thickness, determines the energy of quantum state(s). For example, in the InGaAs/AlGaAs material system, strained wells may comprise an $In_xGa_{1-x}As$ ternary composition, where the In content is on the order of about 1 to 2%. The gain peak wavelength of strained InGaAs quantum wells can exceed 1000 nm.

An illustrated conduction band diagram of an active area having varying degrees of strain introduced in the quantum wells is graphically illustrated in FIG. 12. In this embodiment the well 70 with the most strain has the longest gain peak wavelength and therefore the smallest gain offset. This well 70 may therefore dominate the operation of the laser at low temperatures and is therefore labeled "low" in FIG. 12. The wells 72 and 74 with less strain have shorter gain peak wavelengths and therefore larger gain offsets. These wells 72 and 74 therefore dominate at medium and high temperatures respectively and are labeled "medium" and "high" in FIG. 12.

General Considerations for Gain Separation

In practice, the separation of the gain peak wavelengths of an exemplary active region may be achieved by growing separate quantum well samples and measuring the peak emission wavelength using photoluminescence, electroluminescence or lasing in an edge emitter structure. In accordance with an exemplary embodiment, separate measurements may be performed on each of the quantum wells because once the wells are combined in the same active area, interactions between quantum wells and/or emission spectrum overlap may make if difficult to resolve their respective gain peak wavelengths. Thus, when quantum wells of different gain peak wavelength are combined, the sum effect on temperature sensitivity is may be best measured empirically, that is, via VCSEL performance.

One skilled in the art will recognize that there are advantages and disadvantages associated with each of the approaches to gain separation. For example, adding strain to the quantum wells may allow for sufficient gain separation. However, introducing strain may introduce dislocations and compromise the reliability of the device. In addition, some methods of gain separation may be more readily implemented than others. For example, varying the thickness of the quantum wells is an inherently more controllable process than changing the strain. Finally, one skilled in the art will further recognize that not all of the above methods of gain separation may be implemented independently.

For example, there is a critical strain/thickness limit (called the Mathews-Blakeslee limit) beyond which strained material will relax, become dislocated, and be rendered unsuitable for light emission. Thus adding strain places inherent limits on the number and thickness of the quantum wells. Such non-independent methods may or may not work in concert. For example, in the above case of strain and well thickness, the deeper (more strained) the well, the narrower it has to be. The former effect increases the gain peak wavelength, while the latter effect decreases it. Thus, these two effects work in opposition, and may comprises the level of gain separation and temperature stability that may be achieved.

Gain Matching

In an exemplary method for reducing the temperature sensitivity of a VCSEL, once sufficient gain separation has been achieved, the gain of the various quantum wells is matched to achieve temperature stability over the operating temperature range. It is assumed here that the internal loss and mirror loss $\alpha_1$ and $\alpha_m$ do not vary significantly with temperature. If the internal loss and mirror loss do vary with temperature then, then an exemplary method for reducing the temperature sensitivity of a VCSEL may compensate for their variation via additional gain separation and/or gain matching. However, if the internal loss and mirror loss do not significantly vary with temperature, it follows from equation (1) that the variation in $\eta$ is due almost entirely to variations in $\eta_i$.

The objective of gain matching is to keep the fraction of carriers contributing to stimulated emission, and therefore $\eta_1$ and $\eta$, relatively constant over temperature. In the described exemplary embodiments, gain matching may be achieved by altering the shape of the modal gain/carrier density characteristic such that the carrier leakage is substantially the same fraction of the total operating carrier density at all temperatures. Strictly speaking, $\eta_i$ is the ratio of stimulated to total carrier recombination. However, since leakage carriers do not contribute to stimulated emission, and vice versa, knowing the fraction of leakage carriers yields the fraction of stimulated carriers, and therefore $\eta_i$. Thus it can be said that the fraction of leakage carriers determines $\eta_i$.

The material gain, g, varies with carrier density, N, in accordance with Eq. (2) as follows:

$$g = g_o \ln\left(\eta_i \frac{N}{N_0}\right),\qquad(2)$$

where, $g_o$ is the material gain coefficient and $N_o$ is the transparency carrier density. FIG. 13 graphically illustrates the logarithmic variation of peak material gain with inject carrier density. In operation, threshold is reached when the gain is sufficient to overcome the cavity losses. The modal gain, G, at threshold may be determined as follows:

$$G = \Gamma g = \alpha_i + \frac{\ln(1/R_t R_b)}{L},\qquad(3)$$

where g is the material gain, $\Gamma$ is the gain enhancement factor, L is the length of the cavity and $R_t$ and $R_b$ are the top and bottom mirror reflectivities, respectively. This value of gain, called the operating gain, $G_{op}$, remains relatively constant with temperature. In a conventional laser, any reduction in the gain curve means that a greater amount of carrier are required to achieve the same gain. These extra carriers may include a significant fraction of leakage carriers that, in turn, reduce $\eta_i$.

When two or more quantum wells are gain matched, it means that they have substantially the same carrier leakage, and therefore the same $\eta_i$, for the same value of operating gain. This may or may not mean that they share the same operating carrier density, $N_{op}$, for the same value of operating gain, $G_{op}$. However, to simplify the discussion, we will, for the moment, assume that equivalent carrier densities mean equivalent carrier leakage and therefore equivalent $\eta_i$.

In accordance with an exemplary method for gain matching, the well or group of wells with the shortest gain peak wavelength, which dominate operation of the VCSEL at the highest temperature, may be optimized first. That is, the well with the highest temperature may be designed for the minimum threshold current and maximum slope efficiency possible. In the described exemplary embodiment, the medium and low temperature wells may then be designed to match the gain and carrier density values at lower temperatures of operation.

Figure 14A:
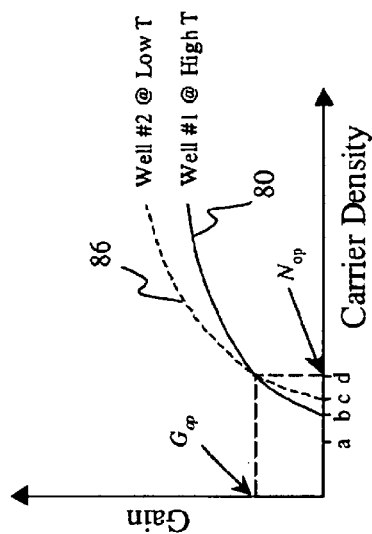
FIG. 14 graphically illustrates the concept of gain matching a) the gain-current density characteristics of the high temperature well #1, b) the gain-current density characteristics of the low temperature well #2, c) the gain-current density characteristics of well #1 (solid line) at high temperature and well #2 (dashed line) at low temperature, and d) the gain-current density characteristics of well #1 (solid line) at high temperature and well #2 (dashed line) at low temperature for the case of slightly different operating currents in accordance with an exemplary embodiment of the present invention.
Figure 14B:
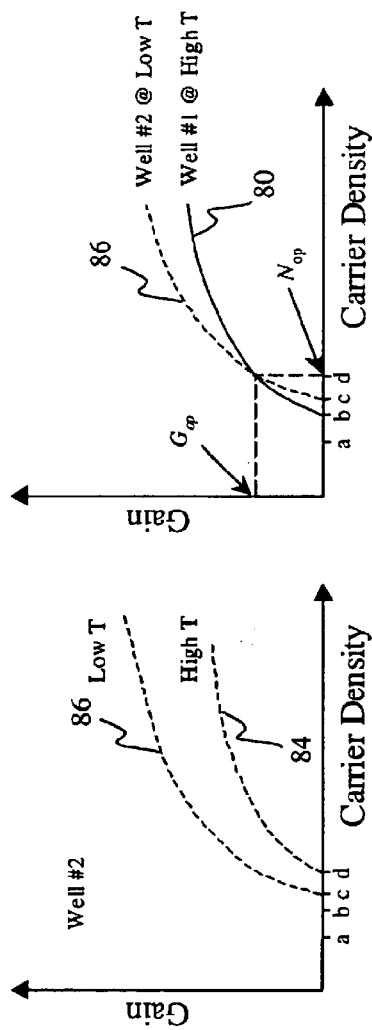
Figure 14C:
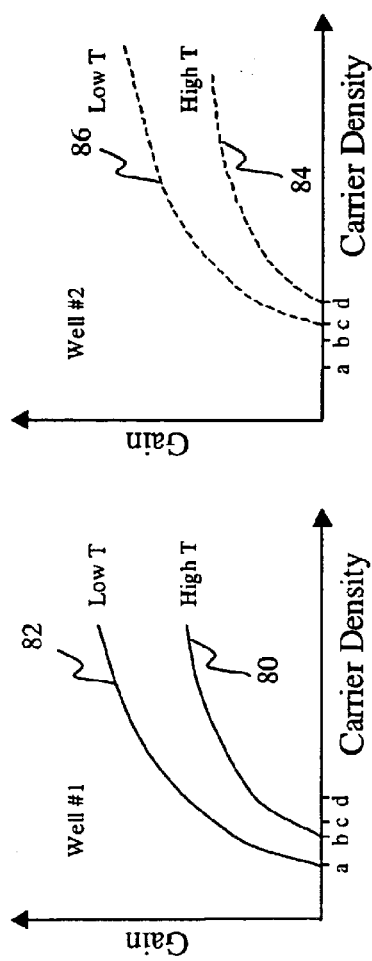

Gain matching may be best demonstrated in the context of an illustrative active region. For example, FIGS. 14a and 14b graphically illustrate the gain-carrier density characteristics of two quantum wells. In the described exemplary embodiment the first quantum well, the high temperature well, has a lower transparency carrier density (labeled points a and b) and steeper slope (differential gain) than the second quantum well (labeled points c and d), i.e. the low temperature well. FIG. 14a shows the gain characteristics 80 and 82 for the first well as a function of temperature, while FIG. 14b shows the gain characteristics 84 and 86 for the second well over temperature. If we superimpose the gain characteristic 86 of the second quantum well at low temperature on the gain characteristic of the first quantum well at high temperature, as in FIG. 14c, we see that the two wells have the same operating carrier density, $N_{op}$, at the operating gain $G_{op}$. For the purposes of illustration it is assumed that the laser is designed such that this level of gain equals the cavity losses.

In this instance $N_{op}$ for each well will be the same even though they operate at different temperatures. Furthermore, the $N_{op}$ will contain approximately the same amount of leakage carriers. Therefore, the first and second wells operate at roughly the same $\eta_i$, with the first quantum well dominating the operation at high temperature and the second quantum well dominating the operation at low temperature. This will result in similar slope efficiencies near threshold over a broad temperature range.

Figure 14D:
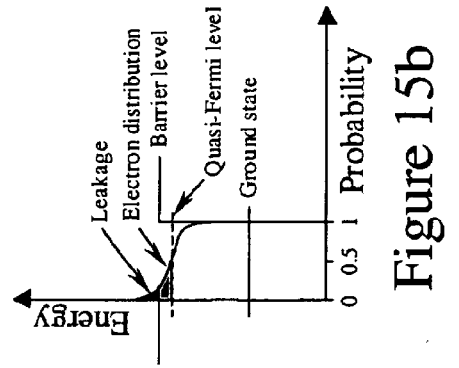

In the above discussion of gain matching, it was assumed that the same overall current density yields the same carrier leakage. This is not entirely the case. In any gain matching design the carrier leakage for a quantum well operating at a high temperature is dominated by temperature-induced thermionic emission whereas the leakage for a well operating at a low temperature may depend more on bias-induced carrier leakage over the wells. $\eta_i$ will be the same for each operating point when the ratio of leakage carriers to total carriers is the same. This may occur at slightly different values of $N_{op}$ for each temperature, as illustrated in FIG. 14d. In general, the difference should be small and will not contribute significantly to the overall variation of $N_{op}$ with temperature.

Figure 15A:
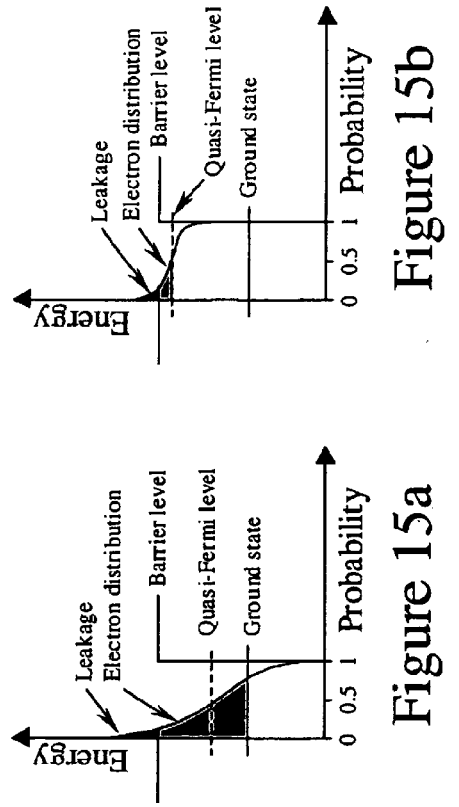
FIG. 15 graphically illustrates the electron distributions in a quantum well for a) a well operating at low temperature and high bias and b) a well operating at high temperature and low bias. The ratio of the area of the black shaded region to the total shaded region gives $\eta_1$ in accordance with an exemplary embodiment of the present invention.
Figure 15B:
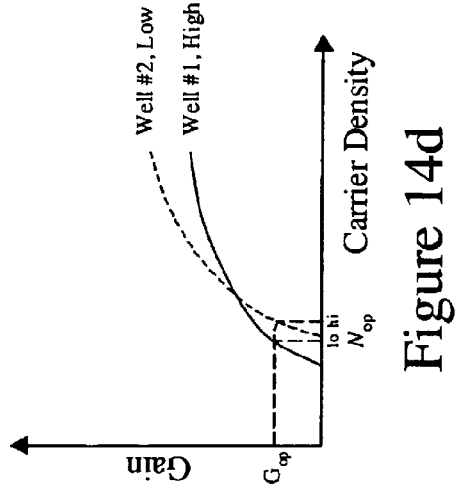

FIG. 15 further illustrates the carrier dynamics of the two operating conditions. FIG. 15a graphically illustrates the electron distribution superimposed on a quantum well for well #1 of FIG. 14a at high temperature. The lower quasi-Fermi level indicates that this well at high temperature is operating at a lower carrier density ($N_{op-lo}$) than well #2 at lower temperature ($N_{o-hi}$), as shown in FIG. 14d. The electron distribution for the higher temperature is smeared out, indicating that there are a significant number of electrons (black shaded area) at the higher end of the energy distribution. It follows that there is significant carrier leakage at this operating point. The electron distribution for well #2 of FIG. 14b is shown in FIG. 15b. It has a higher bias point than well #1 even though it operates at a lower temperature. The Fermi distribution is more abrupt, leaving only a small amount of carriers in the barrier states. It follows that there is less carrier leakage at this operating point. However, since the carrier density, as indicated by the shaded areas of FIG. 15b, is smaller, the overall ratio of leakage carriers (black shaded area) to total carriers (black and gray shaded areas) stays about the same, keeping $\eta_i$ relatively constant at the two temperatures.

Methods of Gain Matching

The shape of the gain curve may be modified by varying one or more of a variety of well characteristics to achieve gain matching. For example, the gain characteristic may be modified by varying the thickness of the quantum well, the well-to-barrier band offsets, the depth of the quantum well, the strain of the well, the number of quantum wells, the active area doping, the gain enhancement factor, carrier transport and non-radiative recombination. We now describe each approach briefly.

Quantum Well Thickness

The threshold gain of a VCSEL depends on quantum well thickness as generally illustrated in FIG 16. For thin wells 90 the quantum state lies near the top of the well 92, causing the barrier states to fill soon after the lowest quantum state, thus reducing the peak gain wavelength. For wide wells 94, an additional quantum state 98 is present in the well, which likewise steal carriers and gain from the primary quantum transition. Thus there exists an optimum quantum well thickness for minimum threshold gain, corresponding to the well thickness that yields the maximum energy separation between the quantum ground state and higher electronic states.

Furthermore, for a constant carrier density the thermionic emission out of the wells varies with the thickness of the quantum well. In thinner wells the carriers need only gain a small amount of energy to escape the well. In wide wells, the carriers need to gain a large amount of energy to escape the well. Thus, carrier leakage out of a quantum well is relatively higher for wells with reduced thickness and lower for wells with greater thickness. A similar situation arises for the leakage over the quantum wells. Thinner wells have a smaller capture coefficient than thicker wells, since there is less distance over which a carrier may be scattered into the well by a phonon. Thus, quantum wells with a reduced thickness have relatively higher carrier leakage as compared to quantum wells with greater thickness.

Adding these effects together produces gain/carrier density characteristics such as those illustrated in FIG. 17. Therefore, an exemplary gain matched active region having quantum wells with different thicknesses may use the optimum well width at the highest temperature and increasingly thinner wells at lower temperatures.

Well-to-Barrier Conduction Band Offset

An exemplary gain matched active region may also comprise quantum wells having different band offsets to modify the leakage over the quantum wells, the leakage out of the well and/or the carrier density in the well. An illustrative band diagram of an active area having barrier layers with varying band offsets was previously illustrated in FIG. 11. In operation, the carrier leakage over and out of the wells is inversely proportional to the size of the conduction band offset, $\Delta E_c$, resulting in gain/carrier density characteristics such as those illustrated in FIG. 18. In the described exemplary active region, the optimum $\Delta E_c$ for a given well thickness, corresponds to the $\Delta E_c$ that yields the maximum energy separation between the lowest quantum state and the next higher energy state. In the $Al_xGa_{1-x}As$ material system, the $\Delta E_c$ is largely determined by the Al composition, with larger values of x yielding larger $\Delta E_c$ $_{up\ to\ x=}0.4$, at which point the $\Delta E_c$ point shrinks linearly to x=1. Note that if $\Delta E_c$ is higher than the surrounding SCH layers, then the carrier injection into the well may be reduced. As a result, depending on the SCH and barrier compositions, this effect may be convolved with the carrier transport effect discussed below.

An exemplary gain matched active region having barriers with varying $\Delta E_c$ may use the largest $\Delta E_c$ for the high temperature well and decreasing $\Delta E_c$ for wells of lower temperature. Advantageously, as $\Delta E_c$ increases the gain peak wavelength decreases, thus the highest temperature well has the largest gain offset.

Quantum Well Depth

One of skill in the art will appreciate that quantum wells of different depth perform much like quantum wells of different $\Delta E_c$, except that the composition of the material used to form the quantum well is varied instead of the composition of the barrier material, as previously illustrated in FIG. 9. For example, in the $Al_xGa_{1-x}As$ system, the bandgap, $E_g$ is largely determined by the Al composition, with larger values of x yielding larger $E_g$. Generally, shallower wells have relatively more leakage out of the well than deeper wells with the same thickness. In addition, deeper wells have a greater capture coefficient, and therefore have less leakage over the well than shallower wells.

In the described exemplary active region, the optimum well depth for a given well thickness corresponds to the well depth that yields the maximum energy separation between the lowest quantum state and the next higher energy state. Adding these effects together produces gain/carrier density characteristics such as those illustrated in FIG. 19. An exemplary gain matched active region comprising quantum wells with varying well depth (composition) may use the optimum well design at the highest temperature and increasing shallower wells at lower temperatures.

Quantum Well Strain

On of skill in the art will appreciate that quantum well strain also affects the gain-current density characteristic. Since quantum well strain changes the bandgap of the material in the well as previously illustrated in FIG. 12, the effective depth of the well may be changed by quantum well strain, resulting in the changes in gain peak wavelength and leakage currents mentioned above. Quantum well strain also influences the density of states in the well, which affects the transparency current density and differential gain of the material. The gain-carrier density characteristics for wells of increasing strain are generally illustrated in FIG. 20. In operation, increasing the material strain (shown as compressive strain in FIG. 20) lowers the transparency current density and increases the differential gain.

An exemplary gain matched active region having strained quantum well may therefore use the highest compressive strain (1–2%) for the high temperature well, and progressive lower strain levels for lower temperature wells. The case of tensile strain is more complex, since tensile strain simultaneously increases the transparency current density and the differential gain. In this case an additional well variation may be used to produce gain matching.

Quantum Well Number

The gain-current density characteristic is also dependent upon the number of quantum wells in an active region. For the same size wells, as the number of quantum wells increases, both the transparency gain and the differential gain increase. FIG. 21 graphically illustrates the relative shape of the gain curve for quantum well active areas containing one quantum well 100, two quantum wells 102 and three quantum wells 104.

An exemplary gain matched active region that utilizes a different number of wells at different operating temperatures may use the largest number of wells at the highest temperature of operation and the smallest number of wells at the lowest temperature of operation. The design of an exemplary gain matched active region may include at least the minimum number of wells required for lasing at the extremes of the temperature range. For example, three well might be required at high temperature, whereas only one well may be required to lase at low temperature. If similar carrier densities produce similar $\eta_i s$, then the three sets of wells may be designed such that the gain curves for the different temperatures of operation intersect at a single point 110, as illustrated in FIG. 22. In accordance with an exemplary embodiment the intersection point 110 may be used to establish the operating point for the VCSEL structure.

Active Area Doping

The gain-current density characteristic is also dependent on the doping of the active area. Acceptor (p-type) and donor (n-type) dopants have opposite effects on the transparency current density and differential gain as generally illustrated in FIG. 23. N-type dopants 112 reduce the transparency current density while decreasing the differential gain relative to the undoped case 114. P-type dopants 116, on the other hand, increase the transparency current density while increasing the differential gain relative to the undoped case 114. Typical doping levels for active areas fall between $1 \times 10^{17}$ cm$^{-3}$ and $1 \times 10^{18}$ cm$^{-3}$.

An exemplary gain matched VCSEL may comprise an active region with one or more quantum wells having the highest differential gain (p-type) at the highest temperature of operation and the lowest differential gain (n-type) at the lowest temperature of operation. Assuming that similar carrier densities produce similar $\eta n_i$, the gain curves of the gain matched wells for the different temperatures of operation will intersect at a single point 120, as in FIG. 23. In the described exemplary embodiment, the level of doping may be chosen such that the point of intersection 120 is equivalent to the operating point for the VCSEL.

Gain Enhancement Factor

In the above discussions of gain we have been referring to the gain that one particular longitudinal mode sees, also called the modal gain. The modal gain is given by $G=\Gamma g$, where $\Gamma$ is the gain enhancement factor and g is the material gain. $\Gamma$ is defined as the normalized fractional overlap of the optical mode with the quantum well. It can be thought of as a means of directly influencing the efficiency of a quantum well in converting carriers to photons. Up to this point we have assumed that the $\Gamma$ of each well is approximately constant and that the modal gain difference used in gain matching are a result of material gain differences. However, since $\Gamma$ depends on the placement of the quantum wells in the cavity spacing the quantum wells appropriately can change the modal gain.

Conventionally, the quantum wells are placed at a peak in the optical standing wave such that there is maximum electric field intensity in the quantum wells. However, if the quantum wells 130 are not placed in the center of the cavity at a peak 132 in the standing wave, as illustrated in FIG. 25, then $\Gamma$ may be significantly reduced. In this case the modal gain/carrier density characteristics for wells of similar material gain will be different, as generally illustrated in FIG. 26. This effect can be used to perform gain matching. An exemplary gain matched active region may therefore be designed to ensure that the highest temperature well have the largest $\Gamma$, while lower temperature wells as designed with decreasing $\Gamma$.

Carrier Transport

Figure 27B:
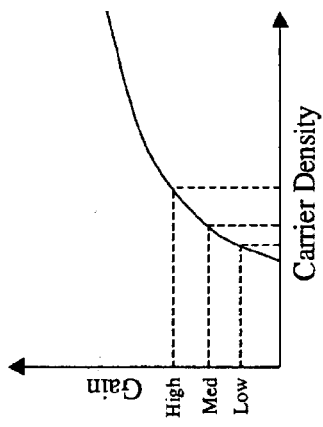
FIG. 27 graphically illustrates the carrier transport for gain matching, a) placement of quantum wells with respect to the hole injection point, b) gain-current density characteristics of quantum wells of different carrier density in accordance with an exemplary embodiment of the present invention.
Figure 27A:
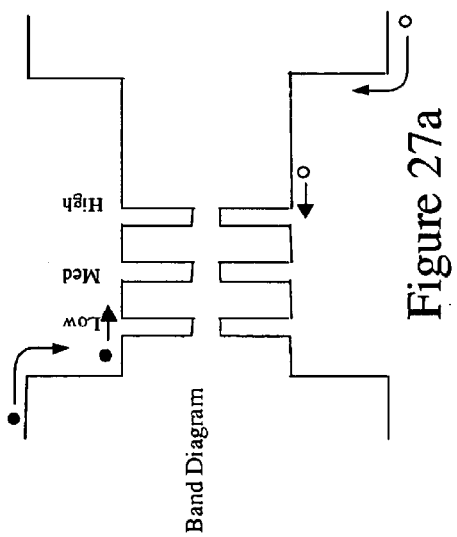

One of ordinary skill in the art will appreciate that the transport of holes through thick layers of undoped material may limit the modulation speed of high-speed lasers. Likewise the transport of holes between a large number of wells may limit the modulation speed due to non-uniform pumping of the wells. In operation non-uniform pumping of the quantum wells implies that each well is operating at a different point on the gain curve. Both of these effects can be used to match the gain of gain-separated quantum wells. For the purpose of illustration, consider an active area having three uniform wells spaced non-uniformly in the active area, as shown in FIG. 27a. In this instance the well closest to the anode captures the most holes and therefore operates at the highest point on the gain curve. Likewise, the well furthest from the anode captures the smallest number of holes and operates at the lowest point on the gain curve. The three wells depicted in FIG. 27a would therefore have operating points as illustrated in FIG. 27b.

In an exemplary active region that utilizes carrier transport to gain match, the highest temperature well may be located in closest proximity to the point of hole injection and the lowest temperature wells are placed further and further from the point of hole injection. One of ordinary skill in the art will appreciate that spatially separated quantum wells in a VCSEL will always have different $\Gamma$s, as previously discussed. Therefore, this effect cannot be separated from the gain enhancement factor effect discussed above. However, the two effects can be made to work in opposition or in concert. If, for example, the well furthest from the point of hole injection is placed at the standing wave peak, then modal gain will be greatest for this well, whereas carrier density will be smallest, thus working in opposition. Conversely, if the well closest to the point of hole injection is placed at the standing wave peak, then modal gain and carrier density will be greatest for this well, and the effects work in concert.

Non-radiative Recombination

Figure 28:
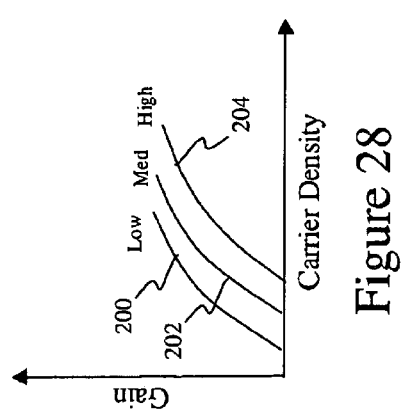
FIG. 28 graphically illustrates the gain-current density characteristics of quantum wells of different non-radiative recombination in accordance with an exemplary embodiment of the present invention.

An alternative method for gain matching to the highest temperature well is to introduce non-radiative recombination centers into the lower temperature wells so as to intentionally degrade their performance. In operation, non-radiative recombination center allow electron-hole pairs to recombine without emitting a photon. Typical non-radiative recombination centers consist of impurity atoms, such as oxygen, or crystalline point defects, such as vacancies or interstitials, or bulk defects such as dislocations. As a practical matter, impurity atoms are well understood in the art and may be introduced in a controlled fashion. FIG. 28 generally illustrates the relative shapes of the gain curves for quantum wells containing a low 200, medium 202 and high 204 number of non-radiative recombination centers.

An exemplary active region comprising quantum wells with non-radiative recombination centers may integrate the lowest number of non-radiative recombination centers into the highest temperature well. In the described exemplary embodiment the lower temperature wells may have increasingly greater amounts of intentionally introduced non-radiative recombination centers.

General Considerations for Gain Matching

The gain matching method may be verified by measuring the gain curve as a function of temperature for separate edge emitter structures for each quantum well or set of wells. In practice, separate gain curve measurements may be performed on separate structure because, once the wells are combined in the same active area, interactions between quantum wells and/or emission spectrum overlap may make it difficult to separate their respective gain curves. However, edge emitters do not provide the longitudinal mode selection that allows gain separation via gain offset modulation (as in a VCSEL), when wells of different gain characteristics are combined. Therefore, the sum effect on the threshold and slope efficiency may be best measured empirically, that is, via VCSEL performance over temperature.

One skilled in the art will recognize that there are advantages and disadvantages associated with each of the described methods of gain matching. For example, adding strain to the quantum wells may improve the overall temperature performance of the device. On the other hand, introducing strain may comprise the reliability of the device.

One skilled in the art will also recognize that some methods of gain matching may be more readily implemented than other methods. For example, changing the thickness of the quantum wells is an inherently more controllable process than changing the strain.

Finally, one skilled in the art will recognize that not all of the above methods of gain matching may be implemented independently. For example, using carrier transport to create a non-uniform injection profile automatically causes some non-uniformity in the confinement factor between the wells. Such non-independent methods may or may not work in concert. For example, in the above case of carrier transport/confinement factor, both effects can be made to work to degrade the performance of the low temperature well as long as the high temperature well is placed at the peak of the optical standing wave in the cavity. However, if the low temperature is placed at the standing wave peak, the two effects will work in opposition.

In accordance with an exemplary embodiment, a VCSEL having a substantially temperature independent slope efficiency may be formed using gain separation and gain matching techniques that are sensitive to the parameter being varied and relatively easy to simulate and control It may also be advantageous to utilize gain separation and gain matching techniques that are largely independent of other variables. For example, an exemplary VCSEL may include an active region comprising quantum wells of varying thickness to provide gain separation. The gain peak wavelength is sensitive to the quantum well thickness, is easily modeled, is easily controlled, and is only weakly linked to the other methods of gain separation and matching. In addition, for gain matching, the gain enhancement factor approach also satisfies the above design criteria. The gain enhancement factor is a very sensitive function of the position of the quantum wells in the cavity. Furthermore, the gain enhancement factor is relatively easy to simulate and control and is substantially independent of all other gain matching methods.

Method for Achieving Temperature Stability

Figure 29:
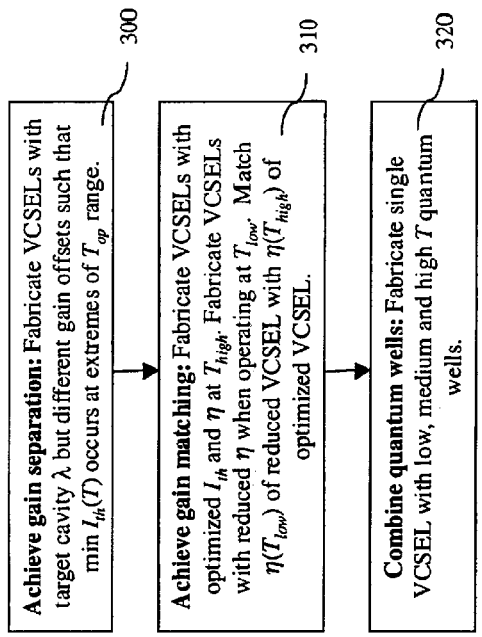
FIG. 29 is a flow chart for a process by which a temperature insensitive VCSEL may be empirically designed in accordance with an exemplary embodiment of the present invention.

Although an understanding of laser dynamics and gain-carrier dynamics is useful to understanding how to achieve gain separation and gain matching, it is likely that the most practical way of achieving a temperature insensitive VCSEL is empirical. We now describe an experimental method of optimizing VCSEL temperature performance. FIG. 29 shows a flow chart of the steps in the described exemplary optimization method.

In the first step 300 gain separation is achieved by fabricating VCSELs with varying degrees of gain offset by using one of the gain separation methods described above. For example, several VCSEL structures of different well thickness but similar cavity wavelength may be fabricated such that the measured minimum $L_{th}$ over temperature, for VCSELS of different well thickness, spans the operating temperature range. Referring back to FIG. 7b, the minima in the "low" and "high" curves, 30 and 26, correspond to the minimum and maximum operating temperatures, respectively. If more or less temperature compensation is required, say for the case of temperature instable internal loss and mirror loss $\alpha_i$ and $\alpha_m$, then the gain offset of the low temperature quantum wells may be adjusted accordingly. Specifically, if $\alpha_i$ and $\alpha_m$ are worse at high temperature, then the minimum $I_{th}$ for the low temperature quantum wells should be made less than the minimum operating temperature, yielding greater temperature compensation. Conversely, if the loss and absorption are better at high temperature, then the minimum $I_{th}$ for the low temperature quantum wells should be made greater than the minimum operating temperature, yielding less temperature compensation.

In accordance with an exemplary method gain matching 310 may now be achieved by fabricating VCSELs with varying η by using one of the gain matching methods described above. For example, several VCSEL structures of different well placement (varying gain enhancement factor Γ) may be fabricated such that the measured η for two different VCSELs is substantially the same when one VCSEL is operating at the minimum temperature and the other VCSEL is operating at the maximum temperature. Finally, the quantum wells may be combined into the same active area 320, with the resulting VCSEL exhibiting stable temperature performance in both $I_{th}$ and η.

Figure 30:
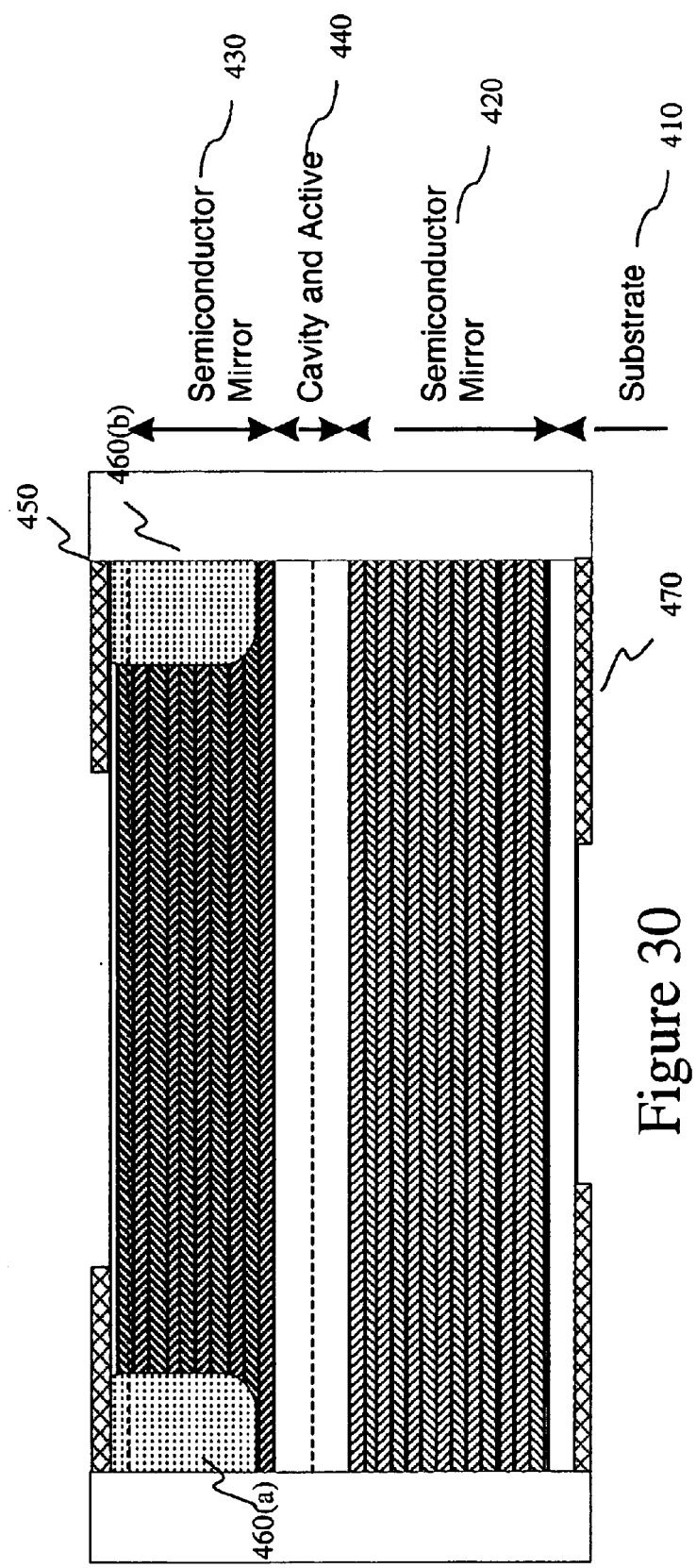
FIG. 30 is a cross-sectional view of a conventional VCSEL structure.

The advantages of the present invention may be best understood in the context of an exemplary VCSEL structure. Referring to FIG. 30, a conventional VCSEL portion of an exemplary embodiment of the present invent is disclosed in U.S. Patent Application Ser. No. 09/237,580, the contents of which are hereby incorporated by reference. Known VCSEL designs include a substrate 410, a first semiconductor mirror 420, an optical cavity 440 and a second or upper mirror 430. As is commonly known in the art, the substrate may be made of gallium arsenide (GaAs) or any other suitable material. The upper and lower mirrors 430 and 420 in accordance with an exemplary embodiment of the present invention may comprise multilayered distributed Bragg reflectors, (DBRs) as is conventional in the art.

In an exemplary embodiment, aluminum gallium arsenide (AlGaAs) and aluminum arsenide (AlAs), with varying concentrations of aluminum and gallium may be used to fabricate the lower and upper mirrors 420 and 430 respectively. In the described exemplary embodiment, the upper and lower mirror may be doped to be opposite conductivity types. In one embodiment, the lower mirror may be doped n-type with a suitable dopant and the upper mirror may be doped n-type. The optical thickness of each mirror layer may be designed to be a quarter wavelength of the emitted light of the laser where the optical thickness is given by the product of the physical thickness and the index of refraction.

An exemplary VCSEL structure may be formed into discrete lasers by a combination of current confinement and ohmic contacts. Current confinement may be achieved by implanting Hydrogen ions at multiple energies as is known in the art. Implantation regions 460(a) and 460(b) convert the upper mirror 430 to high resistivity. The encircling high resistance region forms a funnel to provide current confinement as is known in the art. Other techniques for current constriction, such as selective AlAs oxidation, may also be used.

An upper ohmic contact 450 may be formed above the optical cavity and in one embodiment may be disposed on the upper surface of the VCSEL with an aperture inside the proton blocking aperture. In the described exemplary embodiment a lower ohmic contact 470 may be formed below the optical cavity. For example, in one embodiment the bottom of the substrate may include a contact metalization, forming an lower ohmic contact 470. The lower ohmic contact may be an n-type ohmic and may comprise eutectic gold germanium deposited by electron beam evaporation or sputtering. The upper ohmic contact 450 has an aperture inside the proton blocking aperture, providing a ring contact. In accordance with an exemplary embodiment, the upper ohmic contact 450 may be a p-type ohmic and may comprise gold with 2% beryllium added or a layered structure of titanium/platinum/gold, and may be deposited by electron beam evaporation.

In an exemplary embodiment, current flows from the upper ohmic contact down through the current funnel, into the optical cavity where it recombines with opposite conductivity type carriers flowing up from the bottom lower ohmic contact. The recombination in the optical cavity is a composite of spontaneous and stimulated emission, the stimulated emission exiting the device out the top surface via the aperture in the top p-type ohmic contact. One of skill in the art will appreciate that there are a plurality of suitable VCSEL structures which may be used to practice the present invention. Therefore the disclosed VCSEL structure is by way of example only and not by way of limitation.

Figure 31:
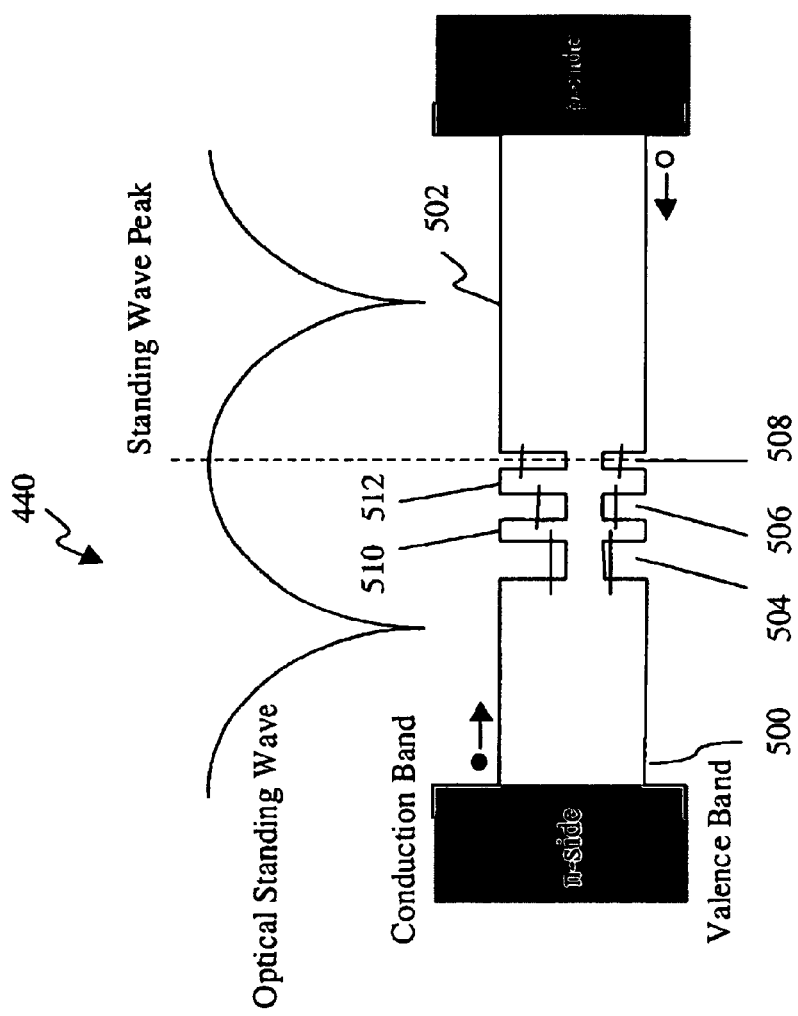
FIG. 31 graphically illustrates the quantum well and barrier and SCH layers of a gain separated and gain matched VCSEL in accordance with an exemplary embodiment of the present invention.

Referring to FIG. 31 an optical cavity 440 in accordance with an exemplary embodiment of the present invention may include an active region surrounded by first and second cladding regions 500 and 502. The first and second cladding regions 500 and 502 may be formed from AlGaAs. In the described exemplary embodiment, the active region may comprise a plurality of quantum wells 504, 506, and 508, with barrier layers 510 and 512 there between. In accordance with an exemplary embodiment, the quantum wells 504, 506, and 508 may comprise GaAs and the adjacent barrier layers 510 and 512 may be made of $Al_{0.25}Ga_{0.75}As$. However, as is generally understood in the art, the materials forming the quantum wells 504, 506, and 508 and surrounding barrier layers 510 and 512 may be varied depending on the design. Therefore, the disclosed optical cavity is by way of example and not by way of limitation.

Although an exemplary embodiment of the present invention has been described, it should not be construed to limit the scope of the appended claims. This invention is not to be limited to the specific arrangements and constructions shown and described. Those skilled in the art will understand that various modifications may be made to the described embodiment. For example, the present invention may be implemented with a variety of material compositions such as those formed from some combination of group III–V compound semiconductors, such as, for example, GaAs/AlGaAs, In GaAs/AlGaAs or InP/InGaAsP, yielding a variety of wavelengths. However, other direct bandgap semiconductors materials may also be used.

Moreover, to those skilled in the various arts, the invention itself herein will suggest solution to other tasks and adaptations for other applications. In particular, the entire invention may be applied to any type of laser in which the number of cavity modes are limited and offset with respect to the gain peak, such as DFB or DBR edge emitting lasers. It is therefore that the present embodiments be considered in all respects as illustrative and not restrictive, reference being made to the appended claims rather than the foregoing description to indicate the scope of the invention.

What is claimed is:

1. A surface emitting laser, comprising; a first mirror; a second mirror; an active region formed between said first and second mirrors, said active region being configured to provide a substantially constant stimulated emission at a cavity wavelength $\lambda$ over an extended temperature range, and said active region, comprising a plurality of quantum wells, wherein in the gain of each of said quantum wells is optimized to operate quasi-independently at different temperatures such that stimulated emission is dominated by a different quantum well at different temperatures.

2. The surface emitting laser of claim 1 wherein thickness of said quantum wells varies from well to well so that transition energy and therefore gain peak wavelength varies from well to well or between groups of wells.

3. The surface emitting laser of claim 1 wherein material composition of said quantum wells varies from well to well to provide varying conduction and valence band offsets between the quantum wells and associated barrier layers.

4. The surface emitting laser of claim 1 wherein said active region further comprises a barrier layer sandwiched between each of said quantum wells, wherein thickness of said barrier layers varies from barrier to barrier so that transition energy and therefore gain peak wavelength varies from well to well.

5. The surface emitting laser of claim 1 wherein said active region further comprises a barrier layer sandwiched between each of said quantum wells, wherein material composition of said barrier layer varies from barrier to barrier so that transition energy and therefore gain peak wavelength varies from well to well.

6. The surface emitting laser of claim 1 wherein material composition of claim quantum wells varies from well to well to induce varying levels of strain from quantum well to quantum well to provide varying conduction and valence band offsets between the quantum wells and associated barrier layers.

7. The surface emitting laser of claim 1 wherein said quantum wells are gain matched such that the fraction of carriers contributing to stimulated emission is substantially constant over temperature.

8. The surface emitting laser of claim 7 wherein thickness of said quantum wells decreases from well to well, such that each well operates at roughly the same internal efficiency $\eta_i$ at different temperatures.

9. The surface emitting laser of claim 7 wherein said active region further comprises a barrier layer sandwiched between each of said quantum wells, wherein material composition of said barrier layers varies from barrier layer to barrier layer so that the barrier layer with the greatest band offset provides a majority of gain at a high operating temperature and the barrier layer with lowest band offset provides majority of gain at a low operating temperature.

10. The surface emitting laser of claim 7 wherein material composition of said quantum wells varies from well to well to provide varying conduction and valence band offsets between the quantum wells and associated barrier layers such that each well operates at roughly the same $\eta_i$ and $\eta$ at different operating temperatures.

11. The surface emitting laser of claim 7 wherein material composition of said quantum wells varies from well to well to induce varying levels of strain from quantum well to quantum well such that the quantum with the highest strain provides the majority of gain at a high operating temperature and the quantum well with the lowest strain provides the majority of gain at a low operating temperature.

12. The surface emitting laser of claim 7 wherein a first group of well comprising a first number of wells provides a majority of gain at a high operating temperature and a second group of wells comprising a second number of wells provides a majority of gain at a low operating temperature and wherein the first number of wells is greater than the second number of wells.

13. The surface emitting laser of claim 7 wherein an optical confinement factor varies from well to well such that the quantum well having the largest optical confinement factor provides a majority of gain at a high operating temperature and the quantum well having the smallest optical confinement factor provides a majority of gain at a low operating temperature.

14. The surface emitting laser of claim 7 wherein said laser further comprises an anode for injecting holes into said active region and wherein the quantum well that supplies a majority of gain at a high operating temperature is closest to said anode and wherein the quantum well that supplies a majority of gain at a low operating temperature is further from said anode.

15. The surface emitting laser of claim 7 wherein a level of non-radiative recombination centers varies from well to well, and wherein the quantum well with the least number of non-radiative recombination centers provides a majority of gain at a high operating temperature and the quantum well with the most non-radiative recombination centers provide a majority of gain at a low operating temperature.

16. A method for forming an extended temperature range vertical cavity surface emitting laser (VCSEL) comprising the steps of:

forming a first mirror;

forming an active region on said first mirror,
said active region being configured to provide a substantially constant stimulated emission at a cavity wavelength $\lambda$ over an extended temperature range without external temperature compensation,
wherein said step of forming said active region comprises forming a plurality of gain separated quantum wells that operate quasi-independently over temperature to provide a dominant portion of said stimulated emission at said cavity wavelength at a predetermined temperature range within said extended temperature range and wherein said quantum wells are gain matched such that the fraction of carriers that contribute to stimulated emission is substantially constant over temperature; and forming a second mirror on said active region.

17. The method of claim 16 wherein the step of forming a plurality of gain separated quantum wells comprises forming a plurality of quantum wells having varying thickness.

18. The method of claim 17 wherein the step of forming a plurality of quantum wells having varying thickness comprises varying the thickness of said quantum wells so that each well dominates operation of the surface emitting laser over a predetermined temperature range.

19. The method of claim 18 wherein the step of forming a plurality of gain matched quantum wells comprises forming a plurality of quantum wells having varying gain enhancement factor.

20. The method of claim 19 wherein the step of forming a plurality of quantum wells having varying gain enhancement factor comprises varying the gain enhancement factor of said quantum wells so that $\eta$ is substantially constant over time.

21. An extended temperature range long wavelength vertical cavity surface emitting laser (VCSEL) comprising:

a first mirror;

a second mirror;

an active region formed between said first and second mirrors, said active region being configured to provide a substantially constant stimulated emission at a cavity wavelength $\lambda$ over an extended temperature range, said active region comprising
a plurality of gain separated quantum wells each respectively configured to have a predetermined gain peak wavelength offset from said cavity wavelength,
said plurality of gain separated quantum wells each respectively providing a dominant portion of said stimulated emission at said cavity wavelength at a predetermined temperature range within said extended temperature range such that said VCSEL operates with a substantially constant stimulated emission at said cavity wavelength over said extended temperature range.

22. The VCSEL of claim 21 wherein said quantum wells are gain matched such that the fraction of carrier contributing to stimulated emission is substantially constant over time.

23. The VCSEL of claim 21 wherein said plurality of gain separated quantum wells includes a plurality of quantum wells at each gain peak wavelength.

24. The VCSEL of claim 23 wherein a first group of wells comprising a first number of wells provides a dominant portion of stimulated emission at a high operating temperature, and a second group of wells comprising a second number of wells provides a dominant portion of stimulated emission at a low operating temperature, and wherein the first number of wells is greater than the second number of wells.

25. An extended temperature range long wavelength vertical cavity surface emitting laser (VCSEL) comprising:

a first mirror;

a second mirror;

an active region formed between said first and second mirrors, said active region being configured to provide a substantially constant stimulated emission at a cavity wavelength $\lambda$ over an extended temperature range, said active region comprising
a first quantum well configured to have a first gain peak wavelength offset from said cavity wavelength, said first gain peak wavelength being a shorter wavelength than said cavity wavelength,
a second quantum well configured to have a second gain peak wavelength offset from said cavity wavelength, said second gain peak wavelength being shorter than said cavity wavelength and longer than said first gain peak wavelength,
said first and second quantum wells each respectively providing a dominant portion of said stimulated emission at said cavity wavelength at a predetermined temperature range within said extended temperature range such that said VCSEL operates with a substantially constant stimulated emission at said cavity wavelength over said extended temperature range.

26. The VCSEL of claim 25 wherein said quantum wells are gain matched such that the fraction of carries contributing to stimulated emission is substantially constant over time.

27. The VCSEL of claim 25 wherein said plurality of gain separated quantum wells includes a plurality of quantum wells at each gain peak wavelength.

28. The VCSEL of claim 27 wherein a first group of wells comprising a first number of wells provides a dominant portion of stimulated emission at a high operating temperature, and a second group of wells comprising a second number of wells provides a dominant portion of stimulated emission at a low operating temperature, and wherein the first number of wells is greater than the second number of wells.

* * * * *